US012068554B2

(12) United States Patent
Danna et al.

(10) Patent No.: US 12,068,554 B2
(45) Date of Patent: Aug. 20, 2024

(54) DUAL-PATH HIGH-SPEED INTERCONNECT PCB LAYOUT SOLUTION

(71) Applicant: Hewlett Packard Enterprise Development LP, Houston, TX (US)

(72) Inventors: Paul Danna, Pearland, TX (US); Vincent W. Michna, Houston, TX (US); Chi Kim Sides, Spring, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 302 days.

(21) Appl. No.: 17/587,818

(22) Filed: Jan. 28, 2022

(65) Prior Publication Data

US 2023/0246353 A1 Aug. 3, 2023

(51) Int. Cl.
| | |
|---|---|
| *H05K 3/34* | (2006.01) |
| *H01R 12/70* | (2011.01) |
| *H01R 12/71* | (2011.01) |
| *H01R 43/02* | (2006.01) |

(52) U.S. Cl.
CPC ......... *H01R 12/716* (2013.01); *H01R 12/707* (2013.01); *H01R 43/0256* (2013.01); *H05K 3/3405* (2013.01)

(58) Field of Classification Search
CPC ............ H01R 12/716; H01R 12/707–43/0256; H05K 3/3405
See application file for complete search history.

(56) References Cited

U.S. PATENT DOCUMENTS

| | | | |
|---|---|---|---|
| 5,805,428 A | 9/1998 | Singer | |
| 6,985,365 B2 * | 1/2006 | Krontz | G06F 13/4027 |
| | | | 333/161 |
| 7,159,203 B2 * | 1/2007 | Yunker | H05K 1/0286 |
| | | | 324/763.01 |
| 7,305,509 B2 * | 12/2007 | Fuller | H05K 1/0295 |
| | | | 710/305 |
| 7,361,981 B2 * | 4/2008 | Lee | H01L 23/585 |
| | | | 257/786 |
| 7,441,222 B2 * | 10/2008 | Mathews | H05K 1/0245 |
| | | | 327/65 |
| 7,453,338 B2 * | 11/2008 | Aronson | H05K 1/0216 |
| | | | 333/260 |
| 9,433,083 B2 * | 8/2016 | Moncayo | H05K 1/025 |
| 11,093,426 B1 * | 8/2021 | Giffen | G06F 13/382 |
| 2005/0052854 A1 | 3/2005 | Kotson et al. | |
| 2010/0012365 A1 | 1/2010 | Hsieh et al. | |

* cited by examiner

*Primary Examiner* — Vanessa Girardi
(74) *Attorney, Agent, or Firm* — Yao Legal Services, Inc.

(57) ABSTRACT

A dual-path signal interconnect is provided. The interconnect can include a first signal trace, first and second solder pads positioned above and connected to the first signal trace, and a third solder pad. The second solder pad separates from the first solder pad. The third solder pad separates from the second solder pad and is connected to a second signal trace. The first and second solder pads are to allow a pin of a connector to be soldered to the first and second solder pads, such that, when the pin of the external connector is soldered, high-speed electrical signals from the first signal trace are routed to the connector. The second and third solder pads are to allow a conductor to be soldered to the second and third solder pads, such that, when the conductor is soldered, the high-speed electrical signals are routed to the second signal trace.

20 Claims, 9 Drawing Sheets

DUAL-PATH HIGH-SPEED INTERCONNECT PCB LAYOUT SOLUTION

BACKGROUND

This disclosure is generally related to the design of a printed circuit board (PCB). More specifically, this disclosure is related to a dual-path high-speed signal interconnect on the PCB that allows a high-speed signal trace to be able to connect to two different types of device interfaces while preserving signal integrity of a high speed channel.

BRIEF DESCRIPTION OF THE FIGURES

In the figures, like reference numerals refer to the same figure elements.

DETAILED DESCRIPTION

Figure 1:
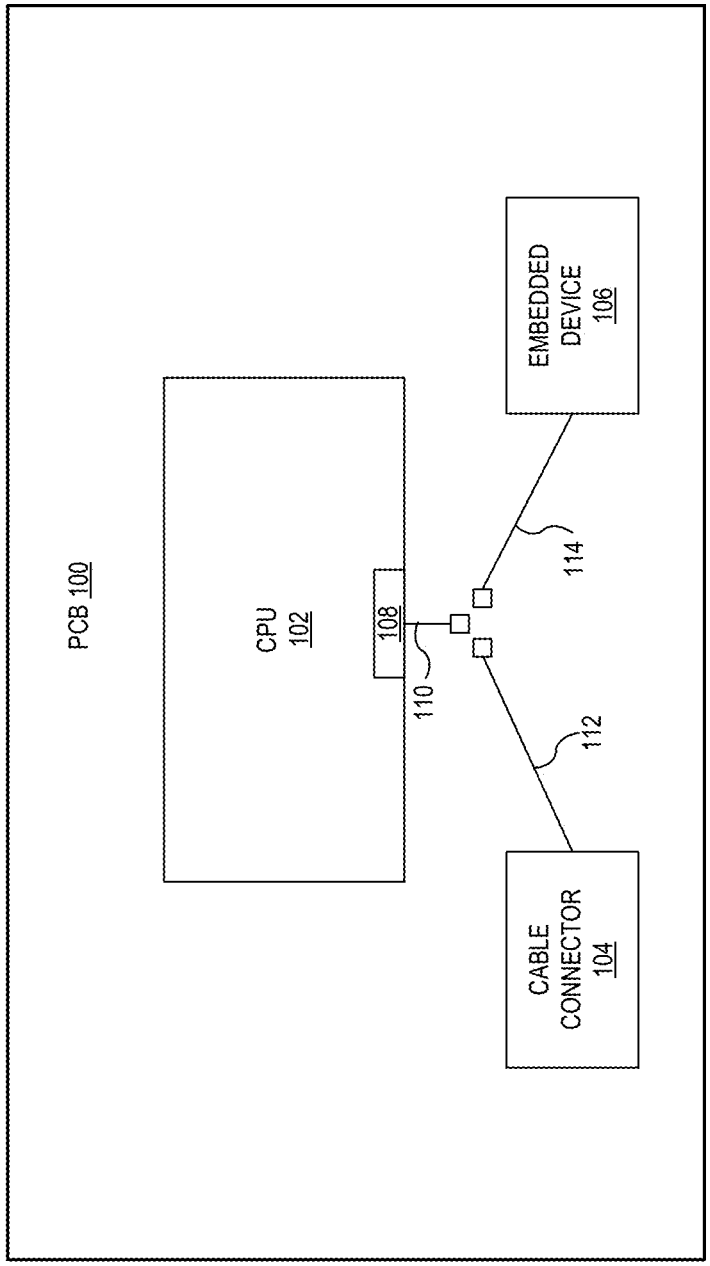
FIG. 1 presents a diagram illustrating a scenario requiring two routing channels for the same high-speed interface.
Figure 1:
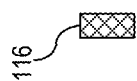

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

The disclosure provides a solution for providing routing paths on a PCB for high-speed busses, such as Peripheral Component Interconnect Express (PCIe) busses. More specifically, the proposed solution allows routing paths to two different types of destinations (e.g., a cable connector and a conductive trace) to co-exist on a common PCB without adding any trace stub, thus significantly reducing cost for developing/fabricating the PCB without affecting signal integrity. The dual-path high-speed interconnect comprises a connector-solder pad for connecting to a cable connector and a pair of resistor-solder pads for connecting to a zero-ohm resistor. The connector-solder pad and one resistor-solder pad are positioned above and connected to a first high-speed signal trace, with a gap between the connector-solder pad and the resistor-solder pad to prevent formation of a stub. The other resistor-solder pad can be positioned above and connected to a second high-speed signal trace, such that when a zero-ohm resistor is soldered onto the pair of resistor-solder pads, high-speed signals from the first high-speed signal trace can be routed to the second high-speed signal trace. On the other hand, if a cable connector is soldered to the connector-solder pad along with the adjacent resistor-solder pad, high-speed signals from the first high-speed signal trace can be routed to the cable connector.

Hardware engineers often face the task of designing PCBs that can be used for multiple purposes. For example, equipment vendors may manufacture servers having a similar specification but which can be used in different environments (e.g., installed on different types of chassis). Due to the different interface requirements of the different chassis, a particular signal trace on the server's motherboard may need to be routed to different destinations. For example, a server used in one type of chassis may have a PCIe bus from its CPU routed to an embedded device (e.g., an embedded storage controller) on the chassis, and a server used in a different type of chassis may have the same PCIe bus routed to a cable connector (e.g., a connector for interfacing with an external storage) on a different type of chassis. To reduce cost, it is desirable to have the two types of server share the same PCB design for their motherboard and use the bill of materials (BOM) stuffing option to select between the two printed-circuit assemblies (PCAs) or two signal routing options. One simple approach is to include two circuits (e.g., two routing channels) for the two different purposes at different locations on the same PCB and to add zero-ohm resistors as BOM options to select between the two routing channels. However, such an approach not only consumes precious board space but may also be problematic for high-speed signals. More particularly, simply using zero-ohm resistors to select between the two different routing channels can add significant stubs to the PCIe interface, which would negatively affect the signal integrity, especially for high speed (e.g., >5 Gbps) signals. Note that the stub refers to a transmission line having one end connected to other circuits and the other end left open. In the above situation, the unpopulated routing channel can create unwanted stubs that can lead to signal degradation.

FIG. 1 presents a diagram illustrating a scenario requiring two routing channels for the same high-speed interface. In FIG. 1, a PCB 100 can include a CPU 102, a cable connector 104, and an embedded device 106. CPU 102 can include a PCIe interface 108, which can be routed to either cable connector 104 or embedded device 106. FIG. 1 also shows that traces 110, 112, and 114 are respectively connected to PCIe interface 108, cable connector 104, and embedded device 106, with each trace including a solder pad at its end.

FIG. 1 also shows a zero-ohm resistor 116 that can be used to couple together trace 110 and trace 112 or to couple together trace 110 and trace 114. When zero-ohm resistor 116 couples trace 110 and trace 112, signals from PCIe interface 108 can be routed to cable connector 104 and then to an external device (e.g., an external storage device) plugged into cable connector 104. Similarly, when zero-ohm resistor 116 couples trace 110 and trace 114, signals from PCIe interface 108 can be routed to embedded device (e.g., an embedded storage controller) 106. Zero-ohm resistor 116 can essentially act as a switch to determine which circuit will be activated in the final PCA. For lower speed signals, this approach is straightforward and easy to implement. However, the solder pads and/or traces that form the two routing channels often add stubs, which can result in degradation of the signal quality. Moreover, this approach requires multiple pairs of solder pads, which increase the footprint of the signal interconnect, thus making this approach less practical for high-density PCBs. Considering that multiple traces from PCIe interface 108 may need to be routed to cable connector 104 and embedded device 106, the increased number of solder pads can significantly increase the overall footprint of the signal interconnect.

To provide a high-speed interconnect with dual routing options without the above problems, according to one aspect of the instant application, the dual-path interconnect can be achieved by modifying the standard footprint of the cable connector to integrate solder pads for the zero-ohm resistor as part of the cable connector footprint. This approach does not add any stub.

Figure 2B:
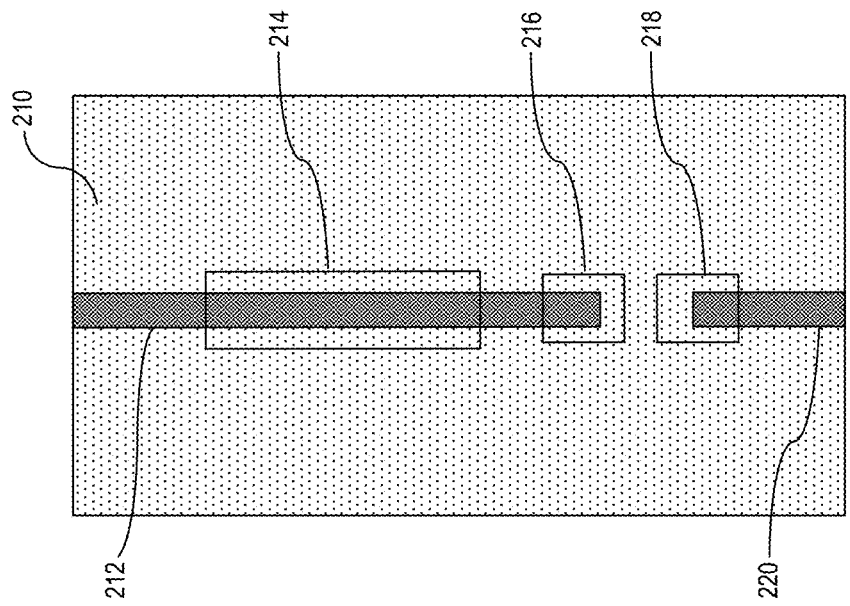
FIG. 2B illustrates a modified footprint of a cable connector pin, according to one aspect of the instant application.
Figure 2A:
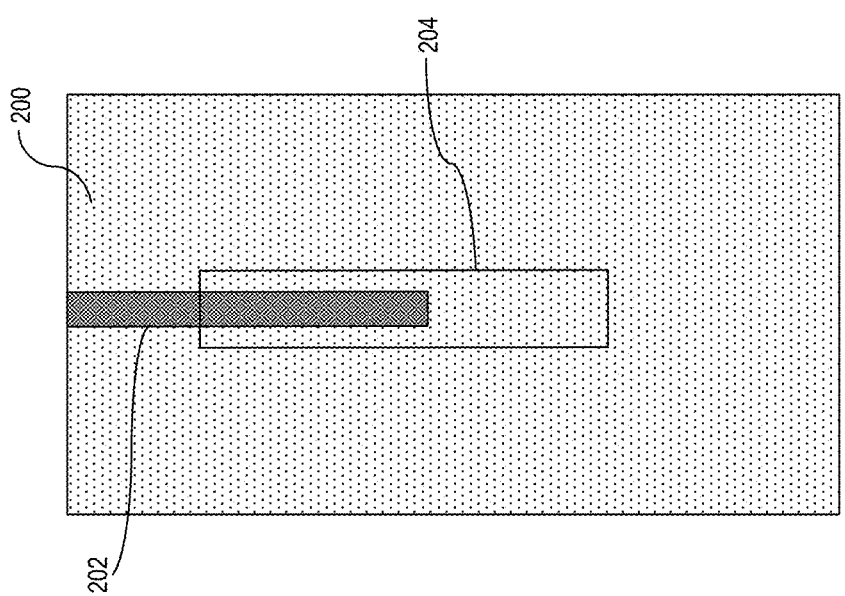
FIG. 2A illustrates a standard footprint of a cable connector pin on a PCB, according to prior art.

FIG. 2A illustrates a standard footprint of a cable connector pin on a PCB, according to prior art. FIG. 2A shows a conductive trace 202 is positioned on the top surface of a PCB 200. More specifically, conductive trace 202 can be a microstrip transmission line. In one example, conductive trace 202 can be used to connect a pin of the PCIe interface of a CPU to a pin of a cable connector. Because FIG. 2A only shows a partial view of PCB 200, the PCIe interface and the portion of conductive trace 202 extending to the PCIe interface is not shown.

FIG. 2A also shows a connector-solder pad 204 positioned on top of conductive trace 202. Connector-solder pad 204 can be a surface mount pad to allow a surface-mount component (e.g., a cable connector) to be electrically connected (e.g., via soldering) to a conductive trace on the PCB. For example, a pin of a cable connector (not shown in FIG. 2A) can be soldered to connector-solder pad 204, thus establishing electrical connection between the connector pin and conductive trace 202. Connector-solder pad 204 can also be referred to as the footprint of the connector pin. To show the portion of conductive trace 202 beneath connector-solder pad 204, connector-solder pad 204 is shown as transparent, although it is actually opaque. In the example shown in FIG. 2A, along the length of connector-solder pad 204, only a portion of connector-solder pad 204 is on top of conductive trace 202 with the remaining portion of connector-solder pad 204 on bare PCB. If conductive trace 202 is electrically connected to a pin of the PCIe interface, signals from that pin can be routed to the cable connector pin soldered to connector-solder pad 204. This is the standard signal interconnect with single-path signal routing.

FIG. 2B illustrates a modified footprint of a cable connector pin, according to one aspect of the instant application. In FIG. 2B, a conductive trace 212 is positioned on the top surface of PCB 210. Like conductive trace 202, conductive trace 212 can be a microstrip for connecting a pin of the PCIe interface of a CPU to a pin of a cable connector. Compared with conductive trace 202, conductive trace 212 extends further.

FIG. 2B also shows a connector-solder pad 214 positioned on top of conductive trace 212. Compared with connector-solder pad 204 shown in FIG. 2A, connector-solder pad 214 has a reduced size. More particularly, the length of connector-solder pad 214 is reduced. With conductive trace 212 being extended, the entire length of connector-solder pad 214 is on top of conductive trace 212. Moreover, conductive trace 212 extends beyond the edge of connector-solder pad 214 to allow a first resistor-solder pad 216 to be formed on top of the end of conductive trace 212. According to one aspect, first resistor-solder pad 216 can be a standard solder pad for soldering a surface-mount resistor, and the size of first resistor-solder pad 216 can be significantly smaller than that of connector-solder pad 204. Note that there is a gap between first resistor-solder pad 216 and connector-solder pad 214 such that they do not touch each other.

In addition to first resistor-solder pad 216, the modified footprint of the connector pin also includes a second resistor-solder pad 218 corresponding to first resistor-solder pad 216. The size of second resistor-solder pad 218 can be similar to that of first resistor-solder pad 216. First and second resistor-solder pads 216 and 218 form a resistor-solder pad pair to allow a surface-mount resistor to be mounted onto PCB 210. Moreover, second resistor-solder pad 218 is arranged to be on top of the end of a conductive trace 220. Conductive trace 220 can be similar to conductive trace 212 and can be a micro strip transmission line. According to one aspect, conductive trace 220 can be connected to a different device (e.g., a surface-mount device) on PCB 210. The different device is not shown in FIG. 2B.

The dimensions of the various components on PCB 210, including conductive traces 212 and 220, and solder pads 214, 216, and 218, can be determined based on practical needs (e.g., the PCB space constraint, transmission losses, size of the surface-mount resistor, etc.). The scope of this disclosure is not limited to the actual dimensions of the conductive traces and the solder pads. The drawings (including FIGS. 2A and 2B) are for illustration purposes only and are not drawn to the actual scale of the components. In one example, the width of conductive traces 212 and 220 can be about 5 mil (or 0.13 mm). The gap between solder pads 214 and 216 can be comparable to the width of the conductive traces (e.g., between 5 mil and 10 mil). The distance between the end of solder pad 214 and the end of conductive trace 212 can be about 0.3 mm. The size of resistor-solder pads 216 and 218 and the gap between them can be determined based on the dimension of the to-be-soldered resistor. In one example, the surface-mount resistor can have a dimension of 0.6 mm×0.3 mm.

From FIG. 2B, one can see that, when first and second resistor-solder pads 216 and 218 are isolated from each other (e.g., when no resistor is soldered to these pads), conductive trace 220 is isolated from conductive trace 212. In this situation, signals from conductive trace 212 can be routed to a cable connector by soldering the cable connector pin to connector-solder pad 214. On the other hand, if the cable connector is not populated on PCB 210 (or not soldered to connector-solder pad 214) and if a low resistance resistor (e.g., a zero-ohm resistor) is soldered onto first and second resistor-solder pads 216 and 218, conductive trace 220 will be electrically connected to conductive trace 212 to allow signals from conductive trace 212 to be routed to conductive trace 220. Through conductive trace 220, the signals can then be routed to a device connected to conductive trace 220.

Figure 3B:
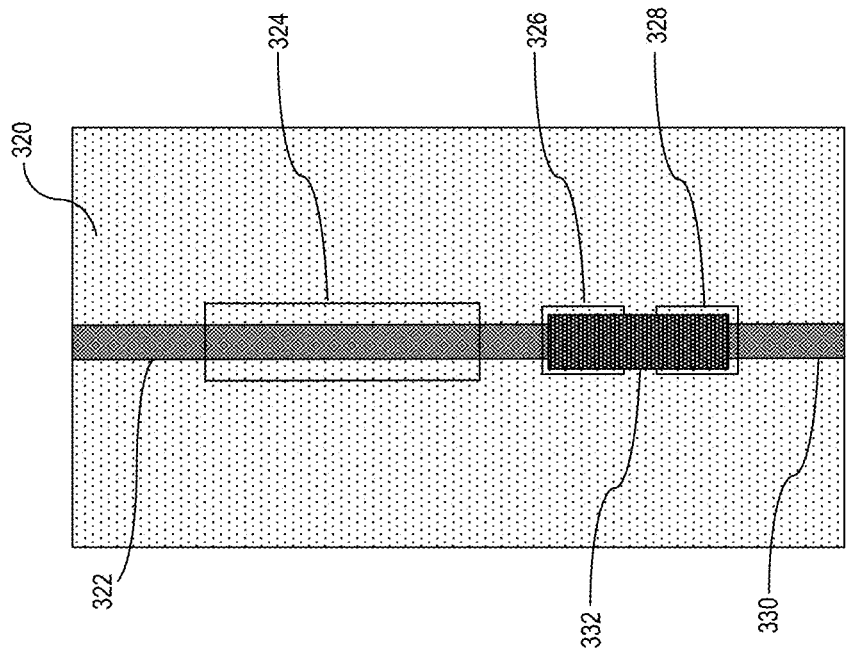
FIG. 3B illustrates a second signal-routing scenario, according to one aspect of the instant application.
Figure 3A:
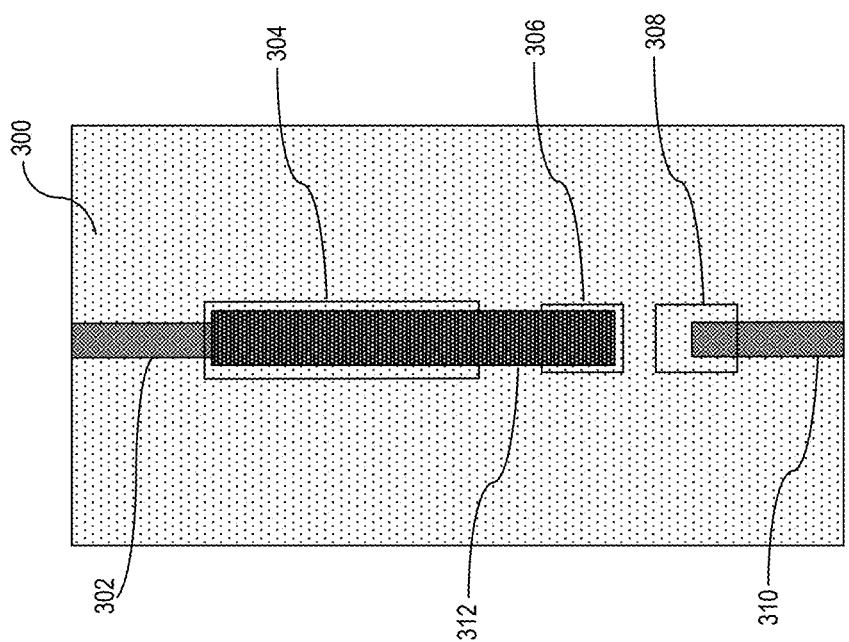
FIG. 3A illustrates a first signal-routing scenario, according to one aspect of the instant application.

FIG. 3A illustrates a first signal-routing scenario, according to one aspect of the instant application. In FIG. 3A, PCB 300 includes a first conductive trace 302 and a second conductive trace 310, which can be similar to conductive traces 212 and 220 shown in FIG. 2B. PCB 300 also includes connector-solder pad 304 and resistor-solder pads 306 and 308, which are similar to connector-solder pad 214 and resistor-solder pads 216 and 218, respectively. In the example shown in FIG. 3A, a connector pin 312 is soldered to both connector-solder pad 304 and resistor-solder pad 306 to provide an enhanced bonding between connector pin 312 and PCB 300. From FIG. 3A, one can see that signals from conductive trace 302 will be routed to connector pin 312. According to one aspect, connector pin 312 can be part of a cable connector to allow signals from conductive trace 302 to be routed to a pluggable device connected to the cable connector. Note that in the example shown FIG. 3A, there is no resistor soldered between resistor-solder pads 306 and 308 such that they remain isolated from each other. Consequently, no signal is routed to conductive trace 310.

FIG. 3B illustrates a second signal-routing scenario, according to one aspect of the instant application. Note that PCB 300 shown in FIG. 3A and PCB 320 shown in FIG. 3B can have the same board design but can be populated with different devices. Like PCB 300, PCB 320 can include a first conductive trace 322 and a second conductive trace 330, which can be similar to conductive traces 302 and 310 shown in FIG. 3A. PCB 320 can also include connector-solder pad 324 and resistor-solder pads 326 and 328, which are similar to connector-solder pad 304 and resistor-solder pads 306 and 308 shown in FIG. 3A, respectively. Unlike the example shown in FIG. 3A, in FIG. 3B there is no connector pin soldered to connector pad 324, because the corresponding cable connector is not populated on PCB 320. Instead, a zero-ohm resistor 332 is soldered, simultaneously, to resistor-solder pads 326 and 328, thus establishing electrical connection between conductive traces 322 and 330. Consequently, signals from conductive trace 322 will be routed to conductive trace 330. According to one aspect, connective trace 330 can be connected to an embedded device (not shown in FIG. 3B) on PCB 320. Note that the embedded device can be on the same side of PCB 320 as conductive trace 322 or on an opposite side. According to an alternative aspect, conductive trace 330 can be connected to a connector at a different location on PCB 320 to allow signals from conductive trace 322 to be routed to the connector.

One can see from FIGS. 3A-3B that the signal interconnect comprising the connector-solder pad and the pair of resistor-solder pads on the PCB can provide two different routing paths, and the selection between these two paths can be achieved via the BOM stuffing option. When the cable connector is populated, the routing path from the first conductive trace is to the cable connector; when the zero-ohm resistor is populated, the routing path from the first conductive trace is to a second conductive trace. This approach is compact (e.g., it requires relatively a small modification to the cable connector footprint) and there is no added stub to the circuit, thus preserving the signal integrity.

Figure 4:
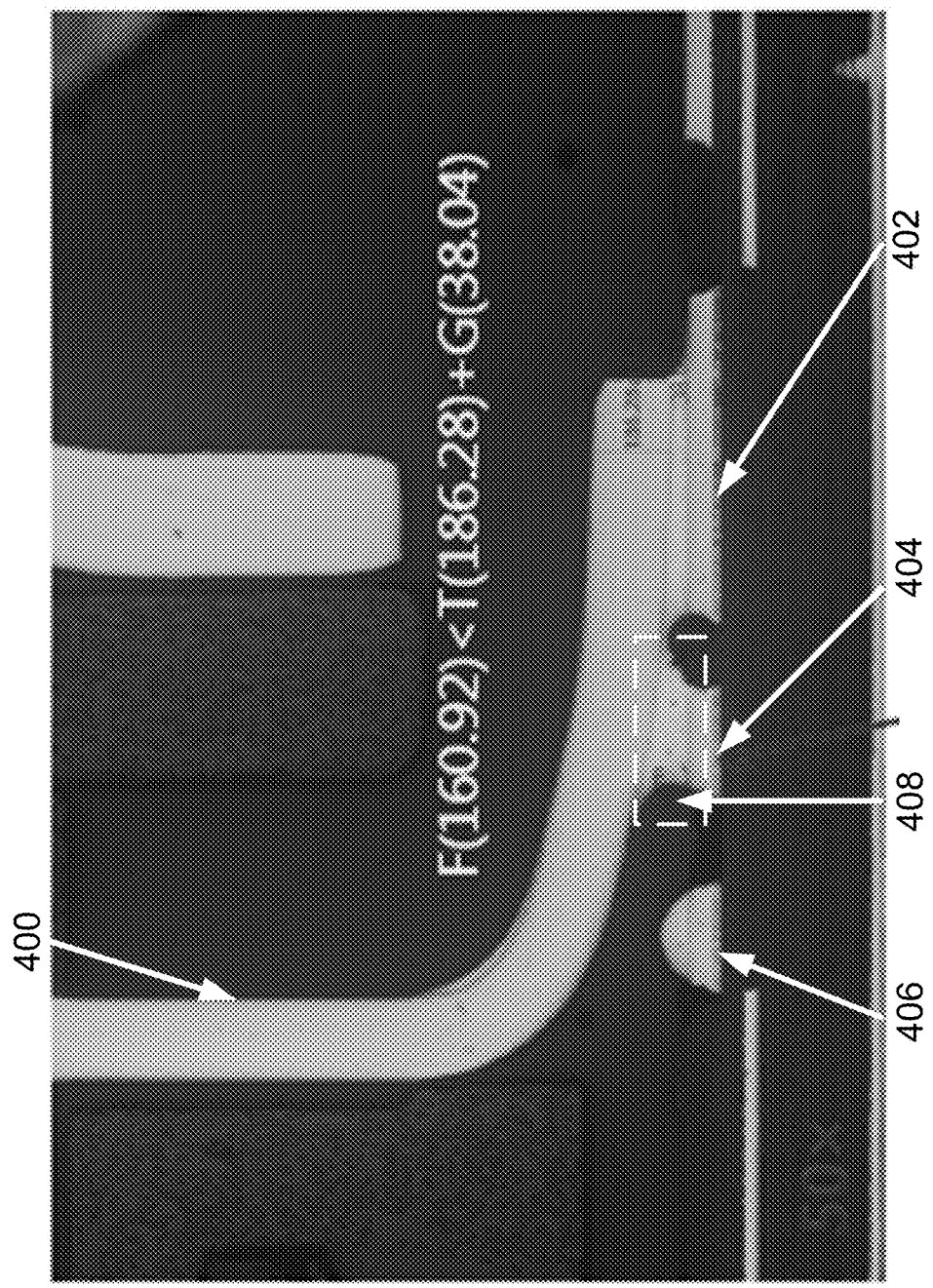
FIG. 4 illustrates a side view of a soldered connector pin, according to one aspect of the instant application.

FIG. 4 illustrates a side view of a soldered connector pin, according to one aspect of the instant application. More specifically, FIG. 4 shows a connector pin 400 being soldered to both connector-solder pad 402 and resistor-solder pad 404. Although there is a gap between connector-solder pad 402 and resistor-solder pad 404, connector pin 400 is able to be soldered onto both pads by applying a sufficient amount of solder. Note the amount of solder should be carefully controlled to avoid excessive solder causing unwanted contact. For example, the solder should not create a contact between resistor-solder pads 404 and 406, as shown in FIG. 4. The dome on top of resistor-solder pad 406 comprises solder, which protects pad 406 from oxidation. FIG. 4 shows that there is no stub created when connector pin 400 is soldered. More particularly, the heel region (indicated by a dashed box 408) of connector pin 400 is filled with solder, thus eliminating the formation of a stub. Similarly, one can imagine that no stub will be formed when a zero-ohm resistor is soldered onto pads 404 and 406. Hence, this solution for providing a dual-path interconnect can be a zero-stub solution, making it ideal for high-speed signals.

Figure 5A:
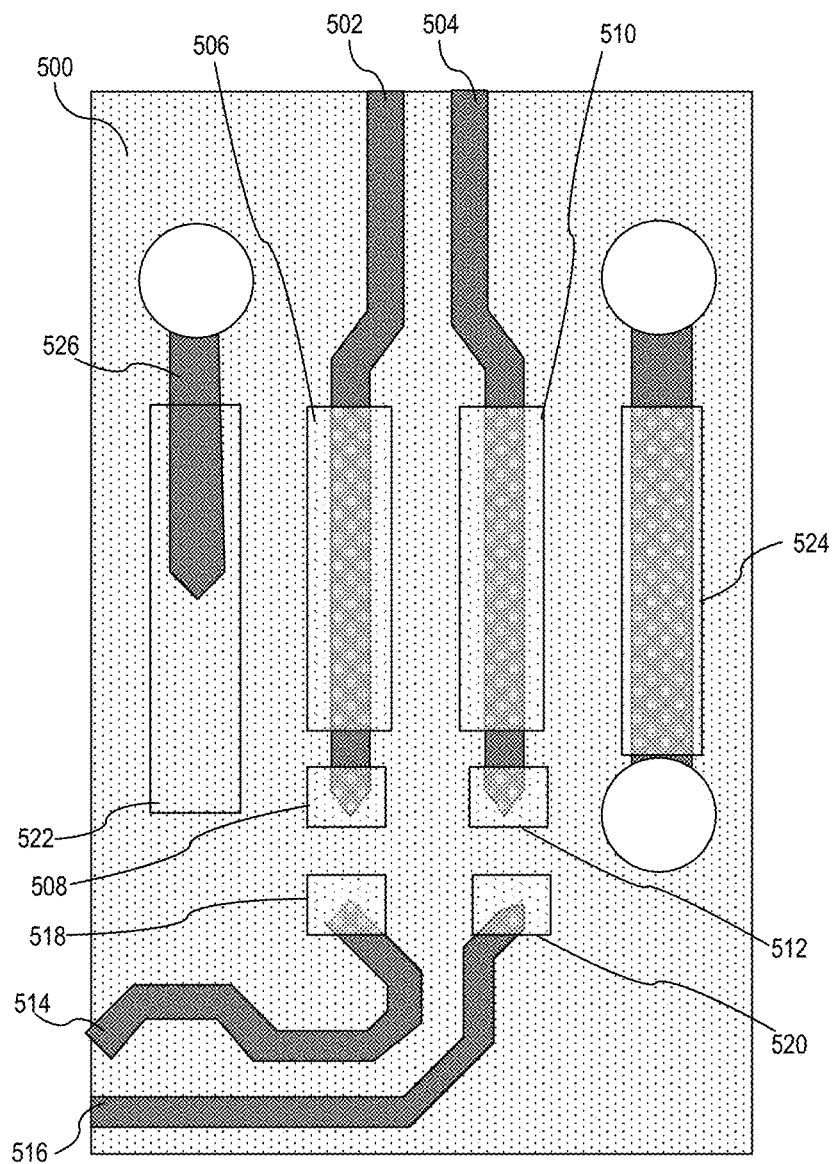
FIG. 5A illustrates a dual-path interconnect for differential signals, according to one aspect of the instant application.

FIGS. 3A-3B show a single conductive trace for carrying single-ended signals. In many situations, differential signals may be needed. This proposed dual-path interconnect solution can also be applied to differential signals. FIG. 5A illustrates a dual-path interconnect for differential signals, according to one aspect of the instant application. In FIG. 5A, PCB 500 can include a pair of conductive traces 502 and 504 that carry differential signals. Conductive traces 502 and 504 can be connected to a high-speed interface of a device on PCB 500. For example, conductive traces 502 and 504 can be connected to a PCIe interface of a CPU mounted on PCB 500. Like conductive trace 212 shown in FIG. 2B, conductive traces 502 and 504 can each be connected to a connector-solder pad and a resistor-solder pad. For example, connector-solder pad 506 and resistor-solder pad 508 are shown to be positioned on top of conductive trace 502, thus being electrically connected to conductive trace 502; conductive-solder pad 510 and resistor-solder pad 512 are shown to be positioned on top of conductive trace 504, thus being electrically connected to conductive trace 504. FIG. 5A also shows another pair of conductive traces (e.g., traces 514 and 516) and solder pads 518 and 520, which are respectively positioned on top of conductive traces 514 and 516. Like what is shown in FIGS. 3A and 3B, when a pair of connector pins are respectively soldered to the connector-solder pads and resistor-solder pads on the pair of conductive traces 502 and 504, differential signals carried by conductive traces 502 and 504 can be routed to the connector. On the other hand, when a pair of zero-ohm resistors is soldered to resistor-solder pads 508 and 518 and resistor-solder pads 512 and 520, differential signals carried by conductive traces 502 and 504 can be routed to conductive traces 514 and 516.

For comparison, FIG. 5A also shows standard connector-solder pads 522 and 524. Connector-solder pad 522 is positioned on top of a conductive trace 526. In this example, there is no need to provide dual routing paths to conductive trace 526 (e.g., conductive trace 526 carries a low-speed signal that can be routed using other mechanisms). Hence, connector-solder pad 522 can be a standard solder pad for soldering a connector pin. On the other hand, connector-solder pad 524 is a ground pad, which can also be a standard solder pad. From FIG. 5A, one can see that, when a conductive trace needs to have dual routing paths, the connector-solder pad connected to the conductive trace can be modified (e.g., reduced in length) to allow a resistor-solder pad to connect to the same conductive trace. The conductive trace itself may also need to be extended to ensure contact with the added resistor-solder pad. This additional resistor-solder pad provides a bridging point to a different conductive trace.

Figure 5B:
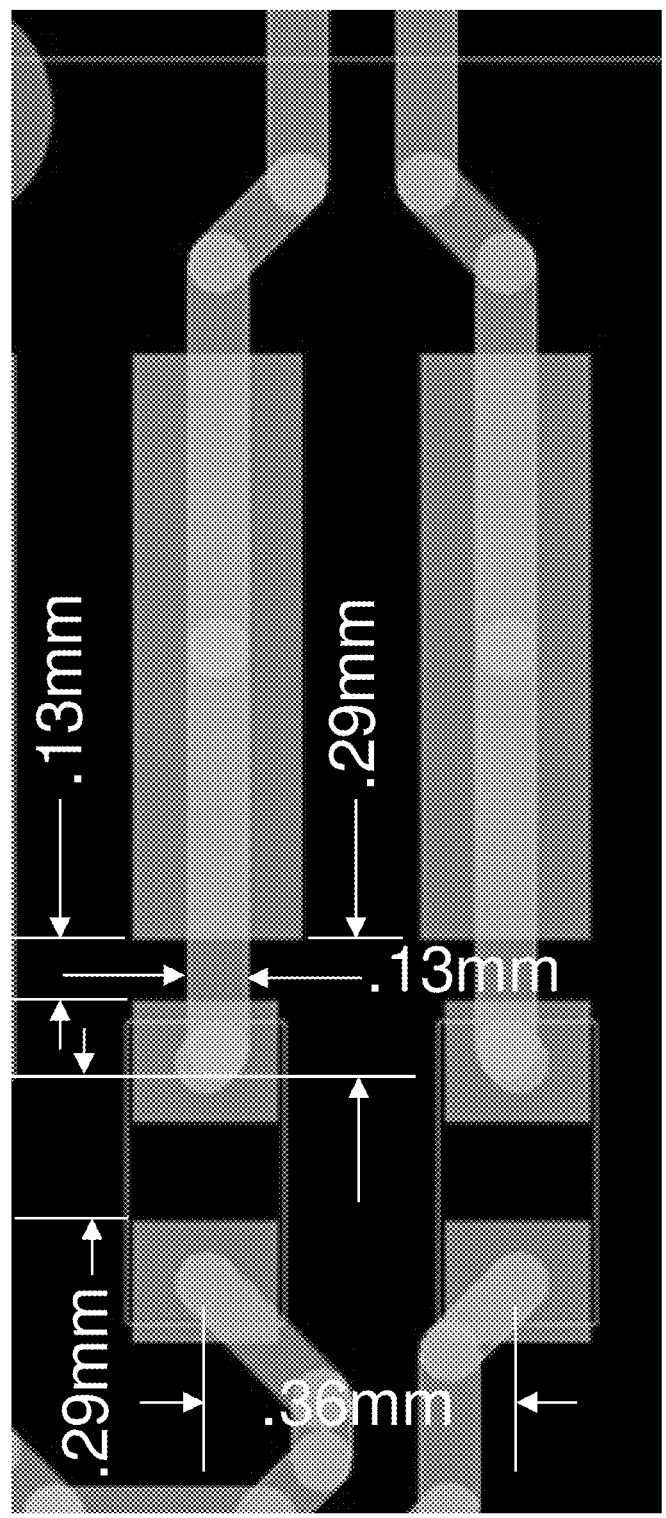
FIG. 5B provides an amplified view of the connector-solder pads and the resistor-solder pads for providing dual-path routing of differential signals, according to one aspect of the instant application.

FIG. 5B provides an amplified view of the connector-solder pads and the resistor-solder pads for providing dual-path routing of differential signals, according to one aspect of the instant application. Exemplary dimensions of the various solder pads, including the size of the gap between adjacent pads are also provided in FIG. 5B.

Figure 6A:
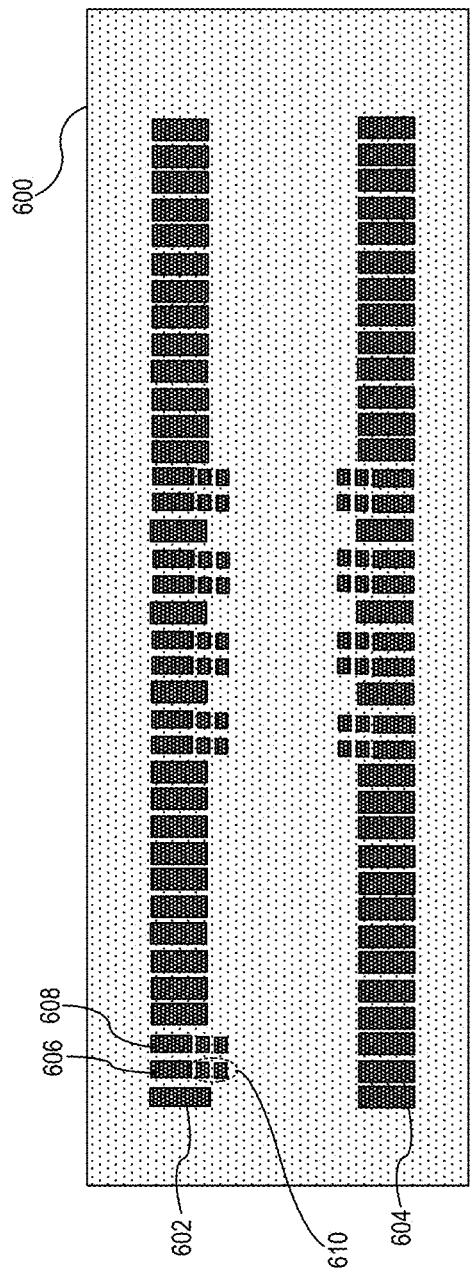
FIG. 6A illustrates a connector footprint for enabling dual-path signal routing, according to one aspect of the instant application.

A typical connector can include many pins and not all signals need to have the dual-path routing option. As shown in FIG. 5A, low-speed (e.g., less than 1 Gbps) and ground signals do not need to use this approach. Hence, not all pin pads of the connector are modified. FIG. 6A illustrates a connector footprint for enabling dual-path signal routing, according to one aspect of the instant application. A connector footprint 600 can include a plurality of connector-solder pads for soldering a connector to the PCB and for establishing electrical connections between the connector and the conductive traces leading to these connector-solder pads. Some of the connector-solder pads are pads of a standard size, such as pads 602 and 604. Note that all solder pads of a conventional connector footprint are standard pads with a uniform dimension. In addition to the standard connector-solder pads, connector footprint 600 can include modified connector-solder pads (e.g., pads 606 and 608) and corresponding resistor-solder pads for providing dual-path signal routing.

A modified connector-solder pad has a reduced length compared with the standard connector-solder pad, and each modified connector-solder pad is accompanied by a pair of resistor-solder pads. For example, modified connector-solder pad 606 is accompanied by a resistor-solder pad pair 610, which is positioned adjacent to and along the longitudinal axis of connector-solder pad 606. The placement of the accompanying resistor-solder pad pair is to ensure that the resistor-solder pad immediately adjacent to the modified connector-solder pad can be electrically connected to the connective trace carrying signals to be routed to the connector.

Figure 6B:
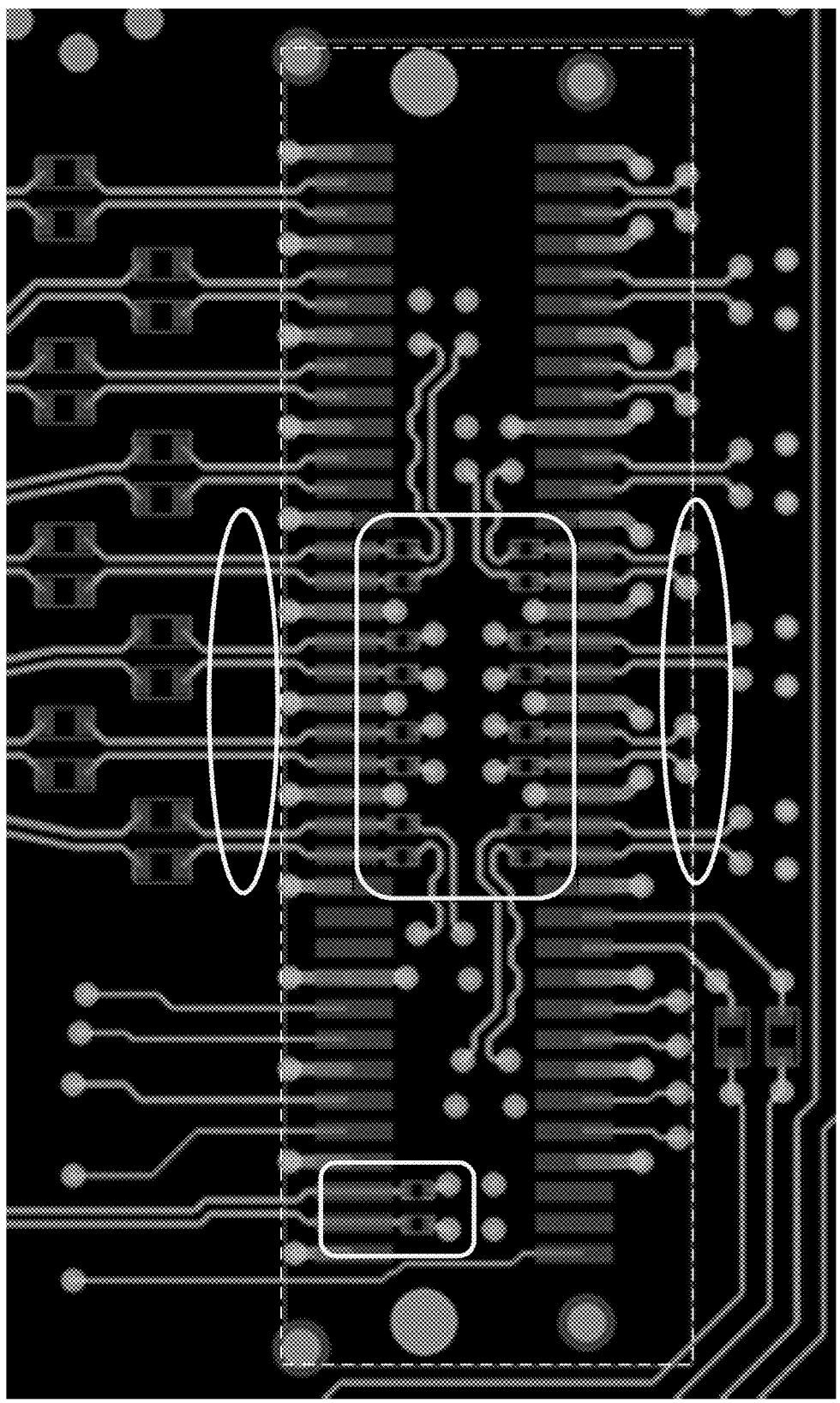
FIG. 6B illustrates a partial top view of the PCB including the connector footprint and conductive traces connected to the connector footprint, according to one aspect of the instant application.

FIG. 6B illustrates a partial top view of the PCB including the connector footprint and conductive traces connected to the connector footprint, according to one aspect of the instant application. The modified connector footprint (as indicated by the dashed box) can be similar to connector footprint 600 shown in FIG. 6A and can include both standard connector-solder pads and modified connector-solder pads. More particularly, regions with modified connector-solder pads are marked using two solid rectangular boxes. The left box includes a pair of modified connector-solder pads connected to a pair of differential conductive traces. In one example, this pair of differential conductive traces can provide a PCIe clock signal, which can be routed either to the connector or to an embedded device. The right box includes four pairs of modified connector-solder pads at its top region. In one example, the four pairs of differential conductive traces (marked by the ellipse above the rectangular box) connected to these modified conductive pads carry high-speed signals transmitted by the PCIe interface. The right rectangular box also includes four pairs of modified connector-solder pads at its bottom region, which are connected to four pairs of differential conductive traces (marked by the ellipse below the rectangular box). In one example, these different conductive traces carry high-speed signals of a PCIe interface. Note that with the connector-solder pads modified and with the inclusion of the corresponding resistor-solder pads, when the connector is not populated and the zero-ohm resistors are populated on the PCB, high-speed signals to and from the PCIe interface can be routed to an embedded device (e.g., an embedded storage device) via the zero-ohm resistors.

In the example shown in FIGS. 6A and 6B, the cable connector has 74 pins. In practice, the proposed solution can be implemented for any type of connectors, regardless of the number of pins or the dimension of each connector-solder pad. According to one aspect, the types of connectors can include but are not limited to: PCIe connectors, Universal Serial Bus (USB) connectors (which can also include different types of USB connectors), Ethernet connectors, etc.

Figure 7:
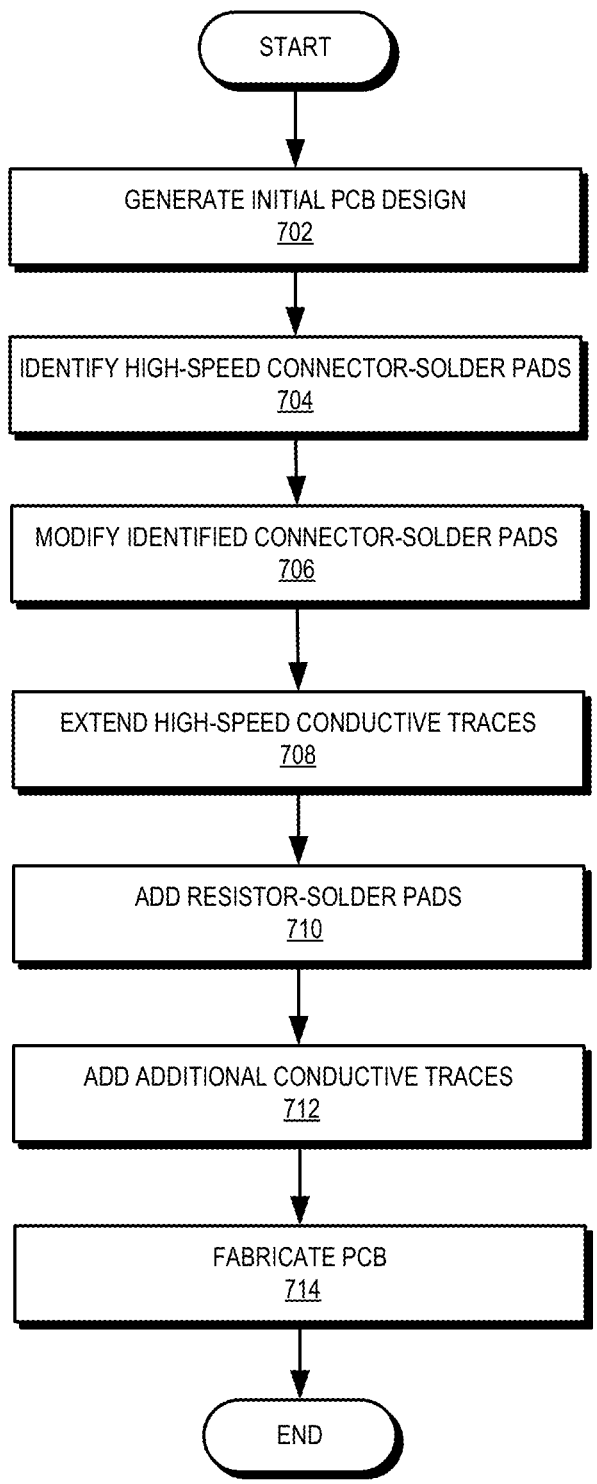
FIG. 7 presents a flowchart illustrating a process of designing a PCB with dual-path interconnect, according to one aspect of the instant application.

FIG. 7 presents a flowchart illustrating a process of designing a PCB with dual-path interconnect, according to one aspect of the instant application. During operation, an initial PCB design can be generated for one routing option (operation 702). For example, the initial PCB design can assume that an external pluggable device will be used, and a PCIe interface of a CPU will be connected to a cable connector. The initial design of the PCB can include a standard cable connector footprint, with all connector-solder pads having a standard size.

Subsequently, one can identify, among all connector-solder pads, a set of pads connected to high-speed signal paths (operation 704). The high-speed signal paths can include PCIe clock signals, PCIe transmit paths, and PCIe receiving paths, etc. Each identified connector-solder pad can then be modified (operation 706). More specifically, the modified connector-solder pad can be shorter. In addition to modifying the connector-solder pad, the high-speed conductive traces connected to the modified connector-solder pad can also be extended (operation 708). With the conductive traces extended and the connector-solder pads shortened, corresponding resistor-solder pads can be added to accompany each modified connector-solder pad (operation 710).

Additional conductive traces can be added to connect the resistor-solder pads to an embedded device (operation 712). The layout of the additional conductive traces can be determined based on the dimension of the embedded device and the available space on the board. The PCB can then be fabricated based on the design (operation 714). Once the PCB is fabricated, it can be used for different applications, either the application using an external pluggable component or the application using the embedded device. When the PCB is used in the application with the pluggable component, the BOM of the PCB can include the pluggable component and a cable connector to be soldered onto the connector pads. On the other hand, when the PCB is used in the application with the embedded device, the BOM of the PCB does not include the cable connector but includes the embedded device and an appropriate number of zero-ohm resistors to be soldered onto the resistor-solder pads.

In general, this disclosure provides a solution to the problem of enabling dual-path signal routing on a PCB without adding any stub. More particularly, in situations where high-speed signals need to have the options of being routed to a pluggable device (e.g., via a cable connector) or an embedded device (e.g., via conductive traces), the cable connector footprint can be modified to enable dual-path signal routing. According to one aspect, a standard connector-solder pad can be shortened to allow the shortened connector-solder pad and a resistor-solder pad to both connect to a conductive trace carrying high-speed signals. The shortened connector-solder pad and the resistor-solder pad should be separated by a gap, which is necessary when the resistor is installed to prevent excess solder and tombstoning. A corresponding resistor-solder pad and an additional conductive trace connected to the corresponding resistor-solder pad can also be included as part of the dual-path high-speed signal interconnect. When a cable connector is soldered to the cable connector footprint, both the shortened connector-solder pad and the adjacent resistor-solder pad would be soldered to a connector pin, allowing high-speed signals from the conductive trace to be routed to the cable connector. On the other hand, when a zero-ohm resistor is soldered onto the pair of resistor-solder pads, high-speed signals from the conductive trace will be routed to the additional conductive trace. This way, the selection between the two routing paths can be achieved using the BOM stuffing options of the PCB. This approach does not add any stub to the signal path, thus making it suitable for high-speed signals.

One aspect of the instant application provides a dual-path signal interconnect on a printed circuit board (PCB). The interconnect can include a first signal trace for carrying high-speed electrical signals, a first solder pad having a first size positioned above and electrically connected to the first signal trace, a second solder pad having a second size positioned above and electrically connected to the first signal trace, and a third solder pad having a third size. The second solder pad separates from the first solder pad by a first gap. The third solder pad separates from the second solder pad by a second gap and is electrically connected to a second signal trace. The first and second solder pads are to allow a pin of an external connector to be soldered simultaneously to the first and second solder pads, such that, when the pin of the external connector is soldered, the high-speed electrical signals are routed to the external connector. The second and third solder pads are to allow a conductor to be soldered simultaneously to the second and third solder pads, such that, when the conductor is soldered, the high-speed electrical signals are routed to the second signal trace.

In a variation on this aspect, the conductor comprises a zero-ohm surface-mount resistor.

In a variation on this aspect, the first size is greater than the second size.

In a variation on this aspect, the second size and the third size are substantially similar.

In a variation on this aspect, no stub is formed when the pin of the external connector is soldered simultaneously to the first and second solder pads or when the conductor is soldered simultaneously to the second and third solder pads.

In a variation on this aspect, the first signal trace is connected to a Peripheral Component Interconnect Express (PCIe) interface of a processor.

In a variation on this aspect, the external connector comprises one of: a Peripheral Component Interconnect Express (PCIe) connector, a Universal Serial Bus (USB) connector, and an Ethernet connector.

In a variation on this aspect, the high-speed electrical signals are differential signals, and the first signal trace comprises a pair of differential signal traces.

One aspect of the instant application provides a printed circuit board (PCB). The PCB can include a plurality of signal traces and a connector footprint connected to the plurality of signal traces. One or more signal traces and a portion of the connector footprint form a dual-path signal interconnect. The dual-path signal interconnect can include a first signal trace for carrying high-speed electrical signals, a first solder pad having a first size positioned above and connected to the first signal trace, a second solder pad having a second size positioned above and connected to the first signal trace, and a third solder pad having a third size. The second solder pad separates from the first solder pad by a first gap. The third solder pad separates from the second solder pad by a second gap and is connected to a second signal trace. The first and second solder pads are to allow a pin of an external connector to be soldered simultaneously to the first and second solder pads, such that, when the pin of the external connector is soldered, the high-speed electrical signals are routed to the external connector; and the second and third solder pads are to allow a conductor to be soldered simultaneously to the second and third solder pads, such that, when the conductor is soldered, the high-speed electrical signals are routed to the second signal trace.

One aspect of the instant application provides a connector footprint for mounting an external connector on a printed circuit board (PCB). The connector footprint can include a first set of connector-solder pads, a second set of connector-solder pads, and a set of resistor-solder pads. A first connector-solder pad within the first set is a standard solder pad for coupling a first pin of the external connector to a signal trace on the PCB. A second connector-solder pad within the second set and a corresponding pair of resistor-solder pads positioned adjacent to the second connector-solder pad form a dual-path signal interconnect capable of routing a signal from a first signal trace connected to the second connector-solder pad to a second pin of the external connector or to a second signal trace connected to a distal resistor-solder pad of the corresponding pair of resistor-solder pads. The second conductor-solder pad and a proximal resistor-solder pad of the corresponding pair of resistor-solder pads are to allow the second pin to be soldered simultaneously to the second conductor-solder pad and the proximal resistor-solder pad, such that, when the external connector is soldered, the signal from the first signal trace is routed to the second pin of the external connector; and the proximal and distal resistor-solder pads are to allow a conductor to be soldered simultaneously to the proximal and distal resistor-solder pads, such that, when the conductor is soldered, the signal from the first signal trace is routed to the second signal trace.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A dual-path signal interconnect on a printed circuit board (PCB), comprising:
   a first signal trace for carrying high-speed electrical signals;
   a first solder pad having a first size positioned above and connected to the first signal trace;
   a second solder pad having a second size positioned above and connected to the first signal trace, wherein the second solder pad separate from the first solder pad by a first gap; and
   a third solder pad having a third size, wherein the third solder pad separate from the second solder pad by a second gap and is connected to a second signal trace;
   wherein the first and second solder pads are to allow a pin of an external connector to be soldered simultaneously to the first and second solder pads, such that, when the pin of the external connector is soldered, the high-speed electrical signals are routed to the external connector; and wherein the second and third solder pads are to allow a conductor to be soldered simultaneously to the second and third solder pads, such that, when the conductor is soldered, the high-speed electrical signals are routed to the second signal trace.

2. The dual-path signal interconnect of claim 1, wherein the conductor comprises a zero-ohm surface-mount resistor.

3. The dual-path signal interconnect of claim 1, wherein the first size is greater than the second size.

4. The dual-path signal interconnect of claim 1, wherein the second size and the third size are substantially similar.

5. The dual-path signal interconnect of claim 1, wherein no stub is formed when the pin of the external connector is soldered simultaneously to the first and second solder pads or when the conductor is soldered simultaneously to the second and third solder pads.

6. The dual-path signal interconnect of claim 1, wherein the first signal trace is connected to a Peripheral Component Interconnect Express (PCIe) interface of a processor.

7. The dual-path signal interconnect of claim 1, wherein the external connector comprises one of:
a Peripheral Component Interconnect Express (PCIe) connector;
a Universal Serial Bus (USB) connector; and
an Ethernet connector.

8. The dual-path signal interconnect of claim 1, wherein the second signal trace is connected to a surface-mount device.

9. The dual-path signal interconnect of claim 1, wherein the high-speed electrical signals are differential signals, and wherein the first signal trace comprises a pair of differential signal traces.

10. A printed circuit board (PCB), comprising:
a plurality of signal traces; and
a connector footprint connected to the plurality of signal traces;
wherein one or more signal traces and a portion of the connector footprint form a dual-path signal interconnect; and
wherein the dual-path signal interconnect comprises:
a first signal trace for carrying high-speed electrical signals;
a first solder pad having a first size positioned above and connected to the first signal trace;
a second solder pad having a second size positioned above and connected to the first signal trace, wherein the second solder pad separates from the first solder pad by a first gap; and
a third solder pad having a third size, wherein the third solder pad separates from the second solder pad by a second gap and is electrically connected to a second signal trace;
wherein the first and second solder pads are to allow a pin of an external connector to be soldered simultaneously to the first and second solder pads, such that, when the pin of the external connector is soldered, the high-speed electrical signals are routed to the external connector; and
wherein the second and third solder pads are to allow a conductor to be soldered simultaneously to the second and third solder pads, such that, when the conductor is soldered, the high-speed electrical signals are routed to the second signal trace.

11. The PCB of claim 10, wherein the conductor comprises a zero-ohm surface-mount resistor.

12. The PCB of claim 10, wherein the first size is greater than the second size.

13. The PCB of claim 10, wherein the second size and the third size are substantially similar.

14. The PCB of claim 10, wherein no stub is formed when the pin of the external connector is soldered simultaneously to the first and second solder pads or when the conductor is soldered simultaneously to the second and third solder pads.

15. The PCB of claim 10, wherein the first signal trace is connected to a Peripheral Component Interconnect Express (PCIe) interface of a processor.

16. The PCB of claim 10, wherein the external connector comprises one of:
a Peripheral Component Interconnect Express (PCIe) connector;
a Universal Serial Bus (USB) connector; and
an Ethernet connector.

17. The PCB of claim 10, wherein the second signal trace is connected to a surface-mount device.

18. The PCB of claim 10, wherein the high-speed electrical signals are differential signals, and wherein the first signal trace comprises a pair of differential signal traces.

19. A connector footprint for mounting an external connector on a printed circuit board (PCB), comprising
a first set of connector-solder pads;
a second set of connector-solder pads; and
a set of resistor-solder pads;
wherein a first connector-solder pad within the first set is a standard solder pad for connecting a first pin of the external connector to a signal trace on the PCB;
wherein a second connector-solder pad within the second set and a corresponding pair of resistor-solder pads positioned adjacent to the second connector-solder pad form a dual-path signal interconnect capable of routing a signal from a first signal trace connected to the second connector-solder pad to a second pin of the external connector or to a second signal trace connected to a distal resistor-solder pad of the corresponding pair of resistor-solder pads;
wherein the second conductor-solder pad and a proximal resistor-solder pad of the corresponding pair of resistor-solder pads are to allow the second pin to be soldered simultaneously to the second conductor-solder pad and the proximal resistor-solder pad, such that, when the external connector is soldered, the signal from the first signal trace is routed to the second pin of the external connector; and
wherein the proximal and distal resistor-solder pads are to allow a conductor to be soldered simultaneously to the proximal and distal resistor-solder pads, such that, when the conductor is soldered, the signal from the first signal trace is routed to the second signal trace.

20. The connector footprint of claim 19, wherein the external connector comprises one of:
a Peripheral Component Interconnect Express (PCIe) connector;
a Universal Serial Bus (USB) connector; and
an Ethernet connector.

* * * * *